(12) United States Patent
Koo et al.

(10) Patent No.: US 10,263,216 B2
(45) Date of Patent: Apr. 16, 2019

(54) ROLLABLE DISPLAY APPARATUS

(71) Applicant: Samsung Display Co., Ltd., Yongin-si, Gyeonggi-do (KR)

(72) Inventors: Hyunwoo Koo, Yongin-si (KR); Taewoong Kim, Yongin-si (KR); Kyuyoung Kim, Yongin-si (KR); Jeongho Kim, Yongin-si (KR); Taean Seo, Yongin-si (KR); Junghun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/784,009

(22) Filed: Oct. 13, 2017

(65) Prior Publication Data

US 2018/0130974 A1    May 10, 2018

(30) Foreign Application Priority Data

Nov. 7, 2016    (KR) ........................ 10-2016-0147634

(51) Int. Cl.
*H01L 51/52*    (2006.01)
*H01L 51/00*    (2006.01)
(Continued)

(52) U.S. Cl.
CPC .... *H01L 51/5253* (2013.01); *G02F 1/133305* (2013.01); *G02F 1/133308* (2013.01);
(Continued)

(58) Field of Classification Search
CPC . H01L 51/52; H01L 51/5253; H01L 51/0037; H01L 51/0097; H01L 27/3244; H01L 2251/5338
See application file for complete search history.

(56) References Cited

U.S. PATENT DOCUMENTS 5,746,868 A * 5/1998 Abe .......................... B22F 7/08
156/247
6,927,344 B1    8/2005 Gall et al.
(Continued)

FOREIGN PATENT DOCUMENTS

KR    10-2006-0123597 A    12/2006
KR    10-2016-0042360 A    4/2016
(Continued)

OTHER PUBLICATIONS

EPO Extended Search Report dated Mar. 5, 2018, for corresponding European Patent Application No. 17200322.0 (9 pages).

*Primary Examiner* — Phuc T Dang
(74) *Attorney, Agent, or Firm* — Lewis Roca Rothgerber Christie LLP (57) ABSTRACT

A rollable display apparatus includes a rolling drum; and a flexible display panel comprising an end bonded to the rolling drum, the flexible display panel being windable around an outer circumferential surface of the rolling drum, the flexible display panel including a flexible substrate including a first surface on which a display device is arranged; and a first protection film over the first surface of the flexible substrate, the first protection film including a first layer including an elastic polymer, and a second layer on the first layer and having a smaller surface frictional force than the first layer, and the second layer includes a plurality of first grooves each indented in a depth direction of the second layer from a surface of the second layer.

24 Claims, 8 Drawing Sheets

(51) Int. Cl.
  *G02F 1/1333* (2006.01)
  *G06F 1/16* (2006.01)
  *G09F 9/30* (2006.01)
  *H01L 27/32* (2006.01)

(52) U.S. Cl.
  CPC ...... *G02F 1/133345* (2013.01); *G06F 1/1601* (2013.01); *G06F 1/1652* (2013.01); *G09F 9/301* (2013.01); *H01L 51/0097* (2013.01); *H01L 51/5237* (2013.01); *G09G 2380/02* (2013.01); *H01L 27/3244* (2013.01); *H01L 2251/5338* (2013.01)

(56) References Cited

U.S. PATENT DOCUMENTS

| | | | |
|---|---|---|---|
| 2005/0140890 A1* | 6/2005 | Kim | G02F 1/133305 349/139 |
| 2005/0253982 A1* | 11/2005 | Paik | G02F 1/1333 349/96 |
| 2007/0176558 A1* | 8/2007 | Kao | H01J 9/205 313/587 |
| 2010/0308335 A1 | 12/2010 | Kim et al. | |
| 2013/0299789 A1* | 11/2013 | Yamazaki | H01L 51/5246 257/40 |
| 2014/0091288 A1* | 4/2014 | Lee | H01L 51/5256 257/40 |
| 2015/0014820 A1* | 1/2015 | Owada | H01L 21/76251 257/622 |
| 2015/0280129 A1* | 10/2015 | Kim | H01L 51/0097 257/40 |
| 2016/0087237 A1* | 3/2016 | Oh | H01L 51/5203 257/40 |
| 2016/0101593 A1 | 4/2016 | Nam et al. | |
| 2016/0155966 A1* | 6/2016 | Kim | H01L 51/0097 257/40 |
| 2016/0233453 A1 | 8/2016 | Lee et al. | |
| 2017/0222178 A1 | 8/2017 | Kang et al. | |

FOREIGN PATENT DOCUMENTS

| | | |
|---|---|---|
| KR | 10-2016-0048690 A | 5/2016 |
| KR | 10-2016-0066423 A | 6/2016 |
| WO | WO 2016/024742 A1 | 2/2016 |
| WO | WO 2016/064240 A1 | 4/2016 |

* cited by examiner

ROLLABLE DISPLAY APPARATUS

CROSS-REFERENCE TO RELATED APPLICATION

This application claims priority to and the benefit of Korean Patent Application No. 10-2016-0147634, filed on Nov. 7, 2016 in the Korean Intellectual Property Office, the entire disclosure of which is incorporated herein by reference.

BACKGROUND

1. Field

Aspects of one or more embodiments relate to a rollable display apparatus.

2. Description of the Related Art

Together with recent developments in display-related technology, flexible display apparatuses capable of being bent or rolled have been researched and developed. Rollable display apparatuses, among the flexible display apparatuses, may be rolled up and stored and may also be unrolled and used, and thus are easy to be stored and used. However, such a rollable display apparatus may accumulate more stress in a direction away from a central axis thereof when being rolled, and, accordingly, layers included in the flexible display apparatus may become detached from one another.

SUMMARY

According to an aspect of one or more embodiments, a rollable display apparatus is capable of distributing stress that is generated while being rolled up.

Additional aspects will be set forth, in part, in the description which follows and, in part, will be apparent from the description, or may be learned by practice of the presented embodiments.

According to one or more embodiments, a rollable display apparatus includes a rolling drum; and a flexible display panel comprising an end bonded to the rolling drum, the flexible display panel being windable around an outer circumferential surface of the rolling drum, the flexible display panel including a flexible substrate including a first surface on which a display device is arranged; and a first protection film over the first surface of the flexible substrate, the first protection film including a first layer including an elastic polymer, and a second layer on the first layer and having a smaller surface frictional force than the first layer, and the second layer includes a plurality of first grooves each indented in a depth direction of the second layer from a surface of the second layer.

First grooves of the plurality of first grooves may extend in a first direction that is parallel to a lengthwise direction of the rolling drum.

Intervals between first grooves of the plurality of first grooves in a second direction perpendicular to the first direction may be different from one another.

The intervals between the first grooves may increase in a direction from the end to another end of the flexible display panel opposite to the end.

The flexible substrate may include a first region including the end, and a second region adjacent to the first region and farther from the rolling drum than the first region, and the plurality of first grooves may be located in the first region of the flexible substrate.

A width of the first region in a second direction perpendicular to the first direction may be twice or less of a perimeter length of the rolling drum.

The flexible display panel may include a display region in which the display device is located, and a boundary between the first region and the second region may be located corresponding to ⅓ or less of a width of the display region in a second direction perpendicular to the first direction.

First grooves of the plurality of first grooves may be filled with an organic material.

The second layer may include an inorganic material, and surfaces of the plurality of first grooves may be coated with a coupling agent.

The flexible display panel may further include a pad unit located on the end, and a circuit substrate electrically connected to the pad unit, the rolling drum may include an insertion groove extending in a lengthwise direction of the rolling drum, and the circuit substrate may be inserted into the insertion groove.

The circuit substrate and the pad unit may be connected to each other by a flexible printed circuit board (PCB) including an integrated circuit, and the flexible PCB may be bent along an outer surface of the rolling drum and extending within the insertion groove.

The flexible display panel may further include a second protection film on a second surface opposite to the first surface.

The second protection film may include a third layer including an elastic polymer, and a fourth layer having a smaller surface frictional force than the third layer, and the fourth layer may be farther from the second surface than the third layer.

The fourth layer may include a plurality of second grooves each indented in a depth direction of the fourth layer from a surface of the fourth layer.

Second grooves of the plurality of second grooves may be filled with an organic material.

An interval between an end of the flexible substrate closest to the rolling drum and an end of the first protection film may be greater than an interval between the end of the flexible substrate and an end of the second protection film.

A pad unit may be located between the end of the flexible substrate and the end of the first protection film.

The second protection film may include a first overlapping portion overlapping with the first protection film, and a second overlapping portion overlapping with the pad unit and separated from the first overlapping portion.

The first overlapping portion may include a plurality of second grooves each indented in a depth direction of the second protection film from a surface of the second protection film.

The flexible display panel may further include a first adhesion layer between the first surface and the first protection film and a second adhesion layer between the second surface and the second protection film.

A plurality of metal particles may be dispersed in the first layer.

The rollable display apparatus may further include a conductive layer between the first protection film and the first surface.

The flexible display panel may further include an encapsulation member located between the flexible substrate and the first protection film and encapsulating the display device.

The display device may include an organic light-emitting device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

As the present invention allows for various changes and numerous embodiments, some embodiments will be illustrated in the drawings and described in further detail in the written description. However, this is not intended to limit the present invention to particular modes of practice, and it is to be appreciated that all changes, equivalents, and substitutes that do not depart from the spirit and technical scope of the present invention are encompassed in the present invention.

While such terms as "first," "second," etc., may be used to describe various components, such components must not be limited to the above terms. The above terms are used only to distinguish one component from another.

The terms used in the present specification are merely used to describe some embodiments, and are not intended to limit the present invention. An expression used in the singular encompasses the expression in the plural, unless it has a clearly different meaning in the context. In the drawings, components may be exaggerated, omitted, or schematically illustrated for convenience and clarity of explanation. For example, sizes and thicknesses of components in the drawings may not completely reflect actual sizes and thicknesses thereof.

It will be understood that when a layer, region, or component is referred to as being "formed on" or "formed under," another layer, region, or component, it can be directly or indirectly formed on or under the other layer, region, or component. That is, for example, intervening layers, regions, or components can be present. The positions "on" and "under" are determined on the basis of the drawings.

One or more embodiments of the present invention will be described below in further detail with reference to the accompanying drawings. Those components that are the same or are in correspondence are provided the same reference numeral regardless of the figure number, and redundant explanations may be omitted.

Figure 1:
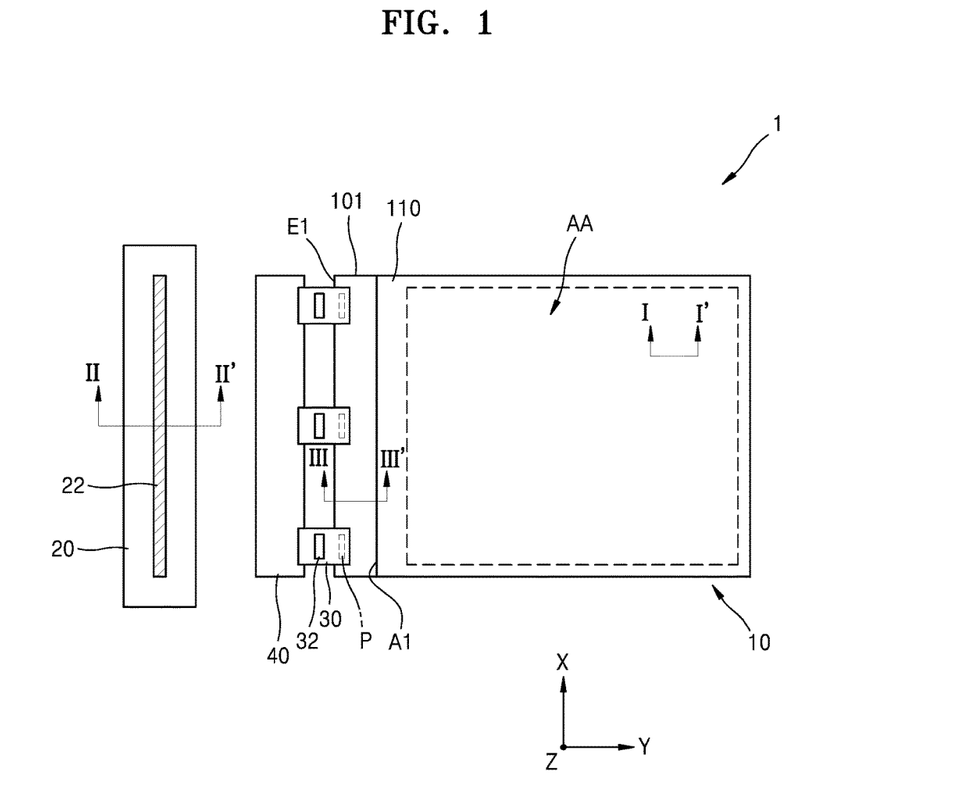
FIG. 1 is a schematic plan view of a rollable display apparatus according to an embodiment of the present invention.
Figure 2:
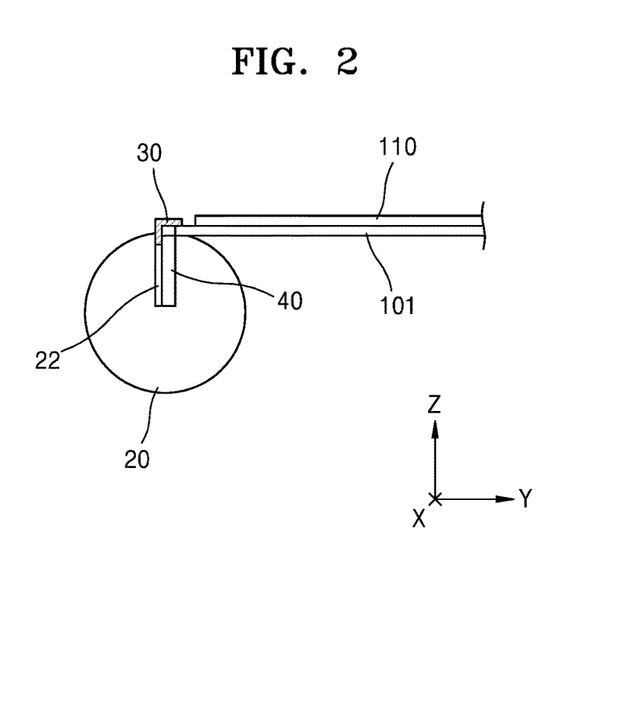
FIG. 2 is a cross-sectional view taken along a line II-II' of FIG. 1, schematically illustrating a combination between a flexible display panel and a rolling drum of the rollable display apparatus of FIG. 1, according to an embodiment.

FIG. 1 is a schematic plan view of a rollable display apparatus according to an embodiment of the present invention; and FIG. 2 is a cross-sectional view schematically illustrating a combination between a flexible display panel and a rolling drum of the rollable display apparatus of FIG. 1, wherein the cross-sectional view is taken along the line II-II' of FIG. 1.

Referring to FIGS. 1 and 2, a rollable display apparatus 1 may include a rolling drum 20, and a flexible display panel 10 having one end combined with the rolling drum 20 and being windable on an outer circumferential surface of the rolling drum 20.

The flexible display panel 10 may include a flexible substrate 101 including a display device 230 (see FIG. 4), and a first protection film 110 over a first surface of the flexible substrate 101.

The flexible display panel 10 may be divided into a display region AA and a non-display region around the display region AA, and the non-display region may include a pad unit P. The pad unit P may be disposed on an end portion of the flexible display panel 10 and may be connected to a gate line and a data line to transmit a scan signal and a data signal to a display layer 200 (see FIG. 3) via a gate line and a data line. The pad unit P is not covered by the first protection film 110. In other words, the first protection film 110 has a smaller size than the flexible substrate 101, and the pad unit P is between an end E1 of the flexible substrate 101 and an end A1 of the first protection film 110.

The flexible display panel 10 may further include a circuit substrate 40 electrically connected to the pad unit P, and the circuit substrate 40 and the pad unit P may be connected to each other by a flexible printed circuit board (PCB) 30 including an integrated circuit (IC) 32.

The rolling drum 20 includes an insertion groove 22 extending in a lengthwise direction (e.g., an X direction) of the rolling drum 20. The circuit substrate 40 is inserted into the insertion groove 22, and thus the flexible display panel 10 and the rolling drum 20 may be coupled to each other. When the circuit substrate 40 is inserted into the insertion groove 22, the flexible PCB 30 may be bent along an outer surface of the rolling drum 20 from within the insertion groove 22. Accordingly, due to rotation of the rolling drum 20, the flexible display panel 10 may be wound around or unwound from the outer circumferential surface of the rolling drum 20, and winding may start from the end E1 of the substrate 101.

Although not shown in FIGS. 1 and 2, the rolling drum 20 may be provided within a housing (not shown), and the flexible display panel 10 may be inserted into the housing while being wound around the outer circumferential surface of the rolling drum 20, and thus may be stably stored in the housing.

Figure 3:
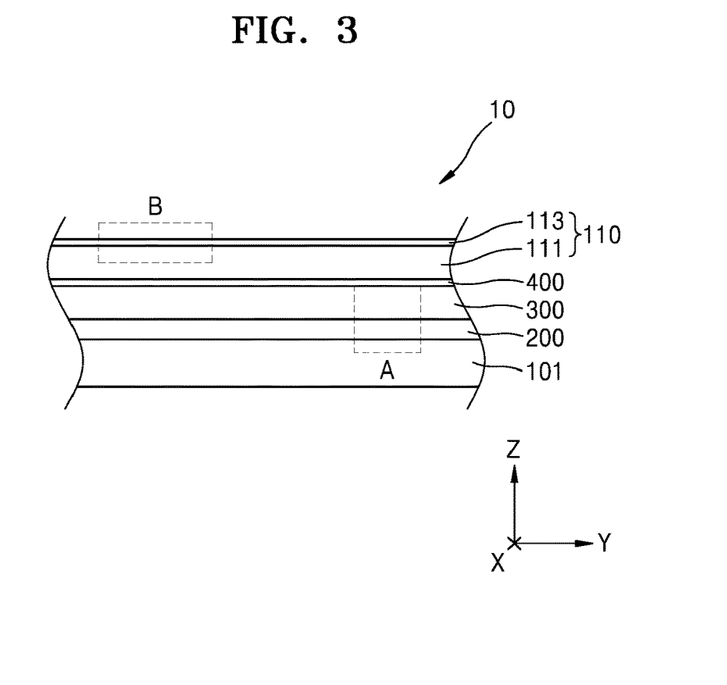
FIG. 3 is a cross-sectional view taken along a line I-I' of FIG. 1, according to an embodiment.
Figure 4:
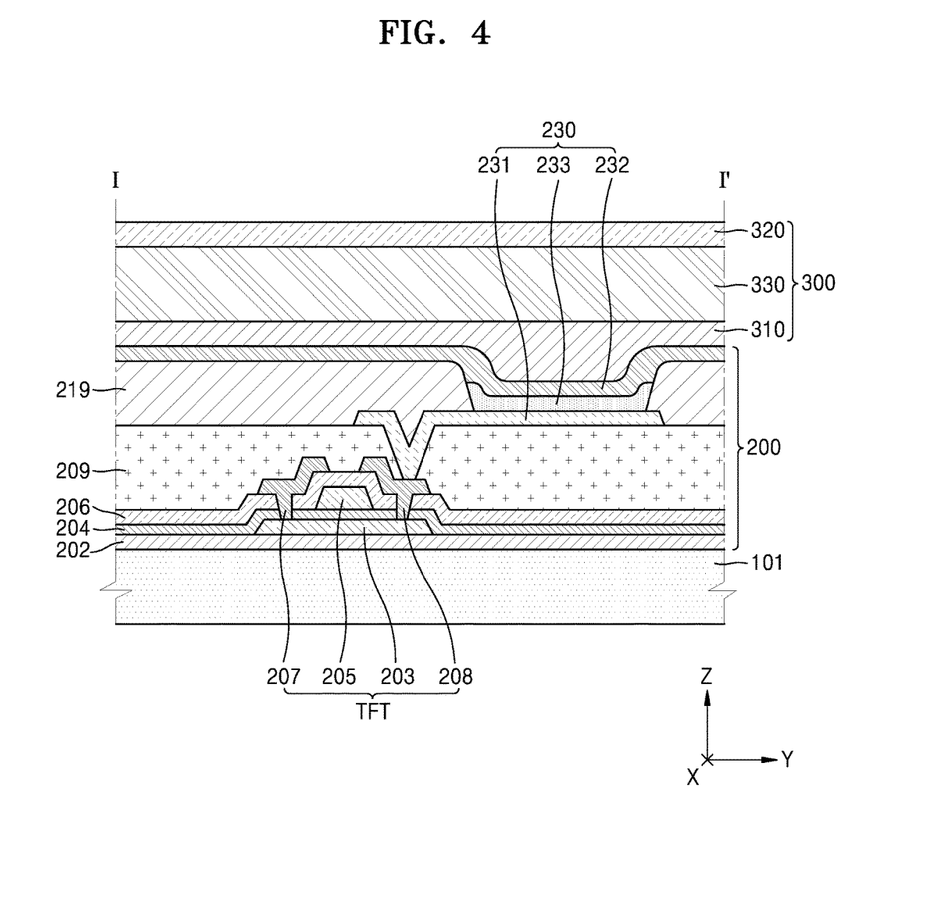
FIG. 4 is an enlarged cross-sectional view of a region "A" of FIG. 3, according to an embodiment.
Figure 5:
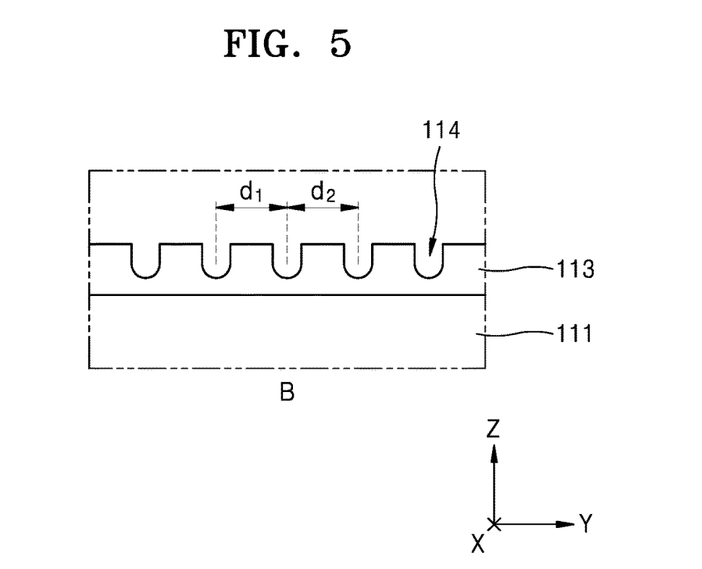
FIG. 5 is an enlarged cross-sectional view of a region "B" of FIG. 3, according to an embodiment.
Figure 6:
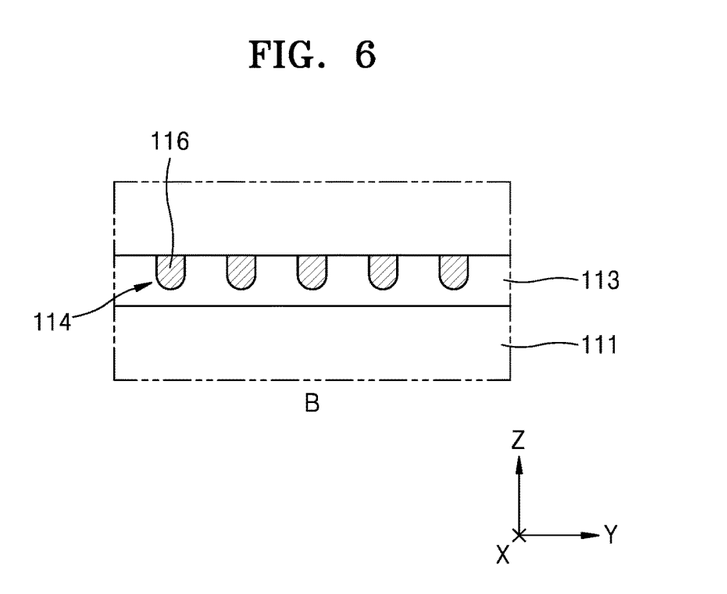
FIG. 6 is an enlarged cross-sectional view of a region corresponding to the region "B" of FIG. 3, according to another embodiment.

FIG. 3 is a cross-sectional view taken along a line I-I' of FIG. 1, according to an embodiment; FIG. 4 is an enlarged cross-sectional view of a region "A" of FIG. 3, according to an embodiment; FIG. 5 is an enlarged cross-sectional view of a region "B" of FIG. 3, according to an embodiment; and FIG. 6 is an enlarged cross-sectional view of a region corresponding to the region "B" of FIG. 3, according to another embodiment.

Referring to FIGS. 3-5, the flexible display panel 10 may include the display layer 200 formed on the flexible substrate 101, an encapsulation member 300 encapsulating the display layer 200, and the first protection film 110.

The flexible substrate 101 is flexible and thus may be formed of any of various materials, such as metal, or plastic, such as polyethylene terephthalate (PET), polyethylene naphthalate (PEN), or polyimide. In some cases, a thin metal foil, such as Steel Use Stainless (SUS), may be used to form the flexible substrate 101.

The display layer 200 may include a thin film transistor TFT and the display device 230. For example, the display device 230 may be an organic light-emitting device, but embodiments are not limited thereto. The display device 230 may be any of various types of light-emitting devices.

A buffer layer 202 may be formed on a first surface of the flexible substrate 101. For example, the buffer layer 202 may include an inorganic material (e.g., silicon oxide, silicon nitride, silicon oxynitride, aluminum oxide, aluminum nitride, titanium oxide, or titanium nitride) or an organic material (e.g., polyimide, polyester, or acryl), or may be formed as a stack of any of these materials.

The thin film transistor TFT may include an active layer 203, a gate electrode 205, a source electrode 207, and a drain electrode 208. A case in which the thin film transistor TFT is of a top gate type in which the active layer 203, the gate electrode 205, the source electrode 207, and the drain electrode 208 are sequentially formed in this stated order will now be described. However, embodiments are not limited thereto, and various types of thin film transistors TFT, such as a bottom gate type thin film transistor TFT, may be employed.

The active layer 203 may include a semiconductor material, such as amorphous silicon or polycrystalline silicon. However, embodiments are not limited thereto, and the active layer 203 may include any of various materials. According to another embodiment, the active layer 203 may include an organic semiconductor material or the like. According to another embodiment, the active layer 203 may include an oxide semiconductor material. For example, the active layer 203 may include an oxide of a material selected from any of Group 12, 13, and 14 metal elements (e.g., zinc (Zn), indium (In), gallium (Ga), tin (Sn), cadmium (Cd), and germanium (Ge)) or a combination thereof.

A gate insulating layer 204 is formed on the active layer 203. The gate insulating layer 204 may be formed of an inorganic material, such as silicon oxide or silicon nitride. The gate insulating layer 204 may have a multi-layer structure or a single-layer structure. The gate insulating layer 204 insulates the active layer 203 from the gate electrode 205.

The gate electrode 205 is formed on the gate insulating layer 204. The gate electrode 205 may be connected to a gate line (not shown) that applies an ON/OFF signal to the thin film transistor TFT. The gate electrode 205 may include a low-resistance metal material. The gate electrode 205 may be formed of at least one selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or multi-layered structure.

An interlayer insulating layer 206 is formed on the gate electrode 205. The interlayer insulating layer 206 insulates the source electrode 207 and the drain electrode 208 from the gate electrode 205. The interlayer insulating layer 206 may be formed of an inorganic material in a multi-layer structure or a single-layer structure. For example, the inorganic material may be metal oxide or metal nitride. In an embodiment, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like.

The source electrode 207 and the drain electrode 208 are formed on the interlayer insulating layer 206. The source electrode 207 and the drain electrode 208 contact the active layer 203. The source electrode 207 and the drain electrode 208 may be formed of at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or multi-layered structure. In an embodiment, the source electrode 207 and the drain electrode 208 may each have a three-layered stack structure of a Ti layer, an Al layer, and a Ti layer.

A passivation layer 209 may cover the thin film transistor TFT. The passivation layer 209 planarizes steps caused by the thin film transistor TFT, thereby preventing or substantially preventing the display device 230 from being damaged by unevenness.

The passivation layer 209 may be a single layer formed of an organic material, or may be a multi-layer including a plurality of organic material layers. The organic material may include a commercial polymer such as polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. In an embodiment, the passivation layer 209 may be formed as a complex stack of an inorganic insulation layer and an organic insulation layer.

The display device 230 is formed on the passivation layer 209. The display device 230 may include a first electrode 231, a second electrode 232 opposite to the first electrode 231, and an intermediate layer 233 between the first electrode 231 and the second electrode 232.

The first electrode 231 may be electrically connected to the source electrode 207 or the drain electrode 208. The first electrode 231 may have any of various shapes. For example, the first electrode 231 may be patterned to have an island shape.

The first electrode 231 may be formed on the passivation layer 209 and may be electrically connected to the thin film transistor TFT via a contact hole formed in the passivation layer 209. The first electrode 231 may be a reflection electrode, for example. For example, the first electrode 231 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and may include a transparent electrode layer formed on the reflection layer. The transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second electrode 232 opposite to the first electrode 231 may have any of various shapes. For example, the second electrode 232 may be patterned to have an island shape. The second electrode 232 may be a transparent electrode. The second electrode 232 may include a metal thin film having a small work function, including Li, Ca, LiF/Ca, LiF/Al, Al, Ag, Mg, or a compound thereof. An auxiliary electrode layer or a bus electrode may be further formed of a material, such as ITO, IZO, ZnO, or $In_2O_3$, on the metal thin film. Accordingly, the second electrode 232 may transmit light emitted by an organic emission layer included in the intermediate layer 233. In an embodiment, the light emitted by the organic emission layer may travel directly toward the second electrode 232, or may be reflected by the first electrode 231 formed as the reflection electrode and then travel toward the second electrode 232.

However, the display layer 200 according to the present embodiment is not limited to a top-emission type, and the display layer 200 may be a bottom-emission type in which the light emitted by the organic emission layer is emitted toward the flexible substrate 101. In this case, the first electrode 231 may be a transparent electrode, and the second electrode 232 may be a reflection electrode. The display layer 200 according to an embodiment may be of a dual emission type that emits light in both directions toward the top surface and the bottom surface of the display layer 200.

A pixel defining layer 219 is formed of an insulating material on the first electrode 231. The pixel defining layer 219 may be formed of at least one organic insulating material selected from the group consisting of polyimide, polyamide (PA), acryl resin, benzocyclobutene (BCB) and phenolic resin, by using a method such as spin coating. The pixel defining layer 219 exposes an area of the first electrode 231. The intermediate layer 233 including the organic emission layer is positioned on the exposed area of the first electrode 231. In other words, the pixel defining layer 219 defines a pixel region of an organic light-emitting device.

The organic emission layer included in the intermediate layer 233 may be a low-molecular weight or high-molecular weight material. The intermediate layer 233 may further include one or more functional layers, such as a hole transport layer (HTL), a hole injection layer (HIL), an electron transport layer (ETL), and an electron injection layer (EIL), in addition to the organic emission layer.

The encapsulation member 300 encapsulating the display layer 200 may be formed on the second electrode 232. The encapsulation member 300 may block external oxygen and external moisture and may include a single layer or a plurality of layers.

In an embodiment, for example, the encapsulation member 300 may include at least one organic layer, namely, an organic layer 330, and at least one inorganic layer, namely, inorganic layers 310 and 320. The organic layer 330 and the inorganic layers 310 and 320 may be alternately stacked on one another. Although the encapsulation member 300 includes the two inorganic layers 310 and 320 and the single organic layer 330 in an embodiment, as shown in FIG. 4, embodiments of the present invention are not limited thereto. In another embodiment, for example, the encapsulation member 300 may further include a plurality of additional inorganic layers and a plurality of additional organic layers that are alternately stacked on one another, and the number of inorganic layers stacked and the number of organic layers stacked are not limited.

The inorganic layers 310 and 320 may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The organic layer 330 may planarize steps caused by the pixel defining layer 219 and reduce stresses generated on the inorganic layers 310 and 320. The organic layer 330 may include, for example, any of polymethyl methacrylate (PMMA), polycarbonate (PC), polystyrene (PS), acryl-based resin, epoxy-based resin, polyimide, and polyethylene.

Although not shown in FIG. 4, the inorganic layers 310 and 320 may have larger areas than the organic layer 330. Thus, the inorganic layers 310 and 320 may contact each other at an edge of the organic layer 330, and accordingly, permeation of external oxygen or moisture may be effectively prevented or substantially prevented.

The first protection film 110 may be formed on the encapsulation member 300. In an embodiment, the first protection film 110 may be bonded to the encapsulation member 300 by an adhesion layer 400.

In an embodiment, the adhesion layer 400 may be formed of a silicon-based adhesive, an acryl-based adhesive, or the like, and may further include a hardener, a cross-linker, an ultraviolet ray stabilizer, or the like. The adhesion layer 400 may decentralize stress that is generated when the flexible display panel 10 is rolled. The adhesion layer 400 may be a pressure-sensitive adhesive (PSA), an optical clear adhesive (OCA), or the like.

The first protection film 110 may protect the display layer 200 and the like from external impacts. The first protection film 110 may include a first layer 111 including an elastic polymer, and a second layer 113 located on the first layer 111 and having a smaller surface frictional force than the first layer 111.

The first layer 111 may include a deformable and highly-restorable elastic polymer. In an embodiment, for example, the first layer 111 may include any of polyurethane, thermoplastic polyurethane, and polydimethylsiloxane. The first layer 111 may effectively decentralize the stress that is generated when the flexible display panel 10 is rolled, together with the adhesion layer 400, and accordingly, may prevent or substantially prevent the layers included in the flexible display panel 10 from being pushed against each other or separated from each other due to stress accumulated at the rolling end. In other words, because the first layer 111 reduces strain of the adhesion layer 400 while the flexible display panel 10 is being rolled, the adhesion layer 400 may prevent or substantially prevent detachment between the adhered layers of the flexible display panel 10.

Because the second layer 113 is formed of a material having a smaller surface frictional force than the first layer 111, the second layer 113 is prevented or substantially prevented from adhering to the first layer 111 while the flexible display panel 10 is being rolled, whereby the flexible display panel 10 may be smoothly rolled. In an embodiment, for example, the second layer 113 may be a coating layer including an oxide, such as indium zinc oxide (IZO), zinc oxide (ZnO), or indium oxide ($In_2O_3$), parylene, and a silicon-based organic material.

According to another embodiment, the second layer 113 may be formed by coating an upper surface of the first layer 111 with a conductive polymer, such as poly(ethylenedioxythiophene) (PEDOT), and a conductive material, such as silver nano wire (AgNW), and accordingly, static electricity generated due to friction during rolling of the flexible display panel 10 may be suppressed or decentralized.

Because the second layer 113 has a smaller mechanical modulus and a narrower elastic deformation region than the first layer 111, the second layer 113 may have damage, such as a crack, due to a stress generated during rolling of the flexible display panel 10. To address this problem, the second layer 113 may include a plurality of first grooves 114 indented in a depth direction of the second layer 113 away from a surface of the second layer 113.

The plurality of first grooves 114 may extend in a first direction (e.g., the X direction) parallel to the lengthwise direction of the rolling drum 20 of FIG. 1. In an embodiment, for example, the plurality of first grooves 114 may be formed on the entire surface of the second layer 113. Accordingly, the stress generated during rolling of the flexible display panel 10 may be absorbed by a change in the shapes of the first grooves 114, and thus damage to the second layer 113 may be prevented or substantially prevented. A size of each first groove 114, namely, the first groove 114 in a second direction (e.g., a Y direction) perpendicular to the first direction (e.g., the X direction), may be several tens of μm or less such that it may not be visually recognized from the outside.

Distances between the plurality of first grooves 114 in the second direction (e.g., the Y direction) may be different from one another. For example, a first distance d1 between two adjacent first grooves 114 and a second distance d2 between two adjacent first grooves 114 may be different from each other. In other words, the distances between the plurality of first grooves 114 may be irregular, and, accordingly, occurrence of a moire phenomenon due to overlapping between the first grooves 114 and lines included in the flexible display panel 10 may be prevented or substantially prevented. During rolling of the flexible display panel 10, because a rolling start portion of the flexible display panel 10 has a smallest radius of curvature, a largest stress may be generated on the rolling start portion. Accordingly, an interval between the plurality of first grooves 114 may increase in a direction from one end of the flexible display panel 10 from which rolling starts to the other end of the flexible display panel 10 opposite to the one end.

A vertical cross-section of each of the plurality of first grooves 114 may have not only a shape in which a lower surface portion thereof is round, as shown in FIG. 5, but also any of various shapes, such as a wedge shape.

Although not shown in FIG. 3, a functional layer may be further included between the encapsulation member 300 and the first protection film 110. The functional layer may include at least one of a polarization layer and a touch screen layer. The functional layer may further include an optic film for external light reflection.

The polarization layer transmits only light vibrating in the same direction as a polarization axis from among light emitted from the display layer 200, and absorbs or reflects light vibrating in directions that are other than the same direction as the polarization axis. For example, the polarization layer may include a phase difference film that changes linearly-polarized light to circularly-polarized light or changes circularly-polarized light to linearly-polarized light by applying a phase difference of λ/4 to two polarized components perpendicular to each other, and may include a polarization film that aligns a direction of light transmitted by the phase difference film, that divides the aligned light into two polarized components intersecting at 90°, that transmits only one component, and that absorbs or disperses the other component. As another example, the polarization layer may be a wire grid polarization pattern including a plurality of wire grids that are arranged.

The touch screen layer may include a touch sensor in which a first electrode and a second electrode alternate with each other. For example, the touch sensor may be an electrostatic capacitive touch sensor that determines a touch or a non-touch by detecting a change in electrostatic capacitance generated by a plurality of first electrodes and a plurality of second electrodes that alternate with each other.

FIG. 6, which is an enlarged cross-sectional view of a region corresponding the region "B" of FIG. 3, illustrates an embodiment in which the first grooves 114 of the second layer 113, formed on the first layer 111, are filled with an organic material 116. The organic material 116 may include, for example, any of PMMA, PC, PS, acryl-based resin, epoxy-based resin, polyimide, and polyethylene, and may prevent or substantially prevent damage to the second layer 113 by reducing stress generated on the second layer 113.

Although, in an embodiment, the organic material 116 fills only the first grooves 114, and the surface of the second layer 113 is exposed between the first grooves 114, as shown in FIG. 6, embodiments are not limited thereto, and, in another embodiment, the organic material 116 may fill the entire upper surface of the second layer 113.

In an embodiment, a coupling agent is coated with the surfaces of the first grooves 114 and the second layer 113 includes an inorganic material, such that a bonding strength between the second layer 113 and the organic material 116 may improve. For example, the coupling agent may be a silane coupling agent, and, accordingly, even when the shapes of the first grooves 114 change while the flexible display panel 10 of FIG. 3 is being rolled, firm bonding between the second layer 113 and the organic material 116 may be maintained.

Figure 7:
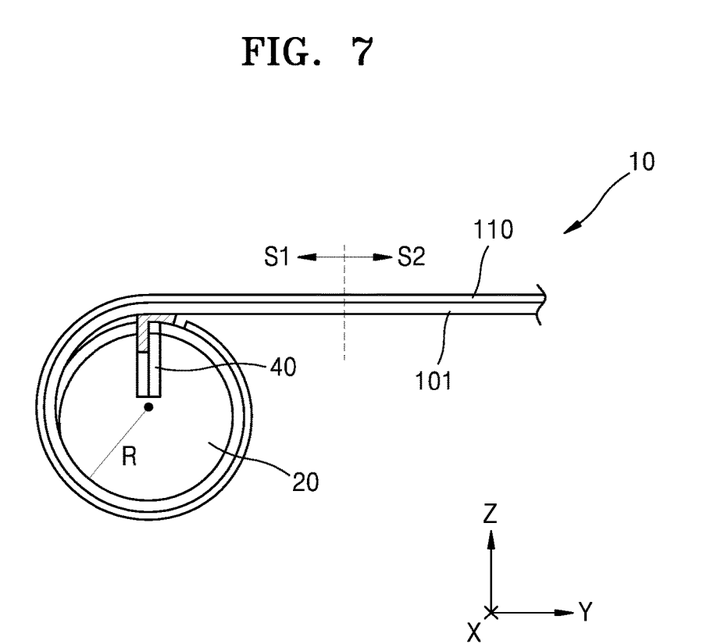
FIG. 7 is a schematic cross-sectional view of the rollable display apparatus of FIG. 1.
Figure 8:
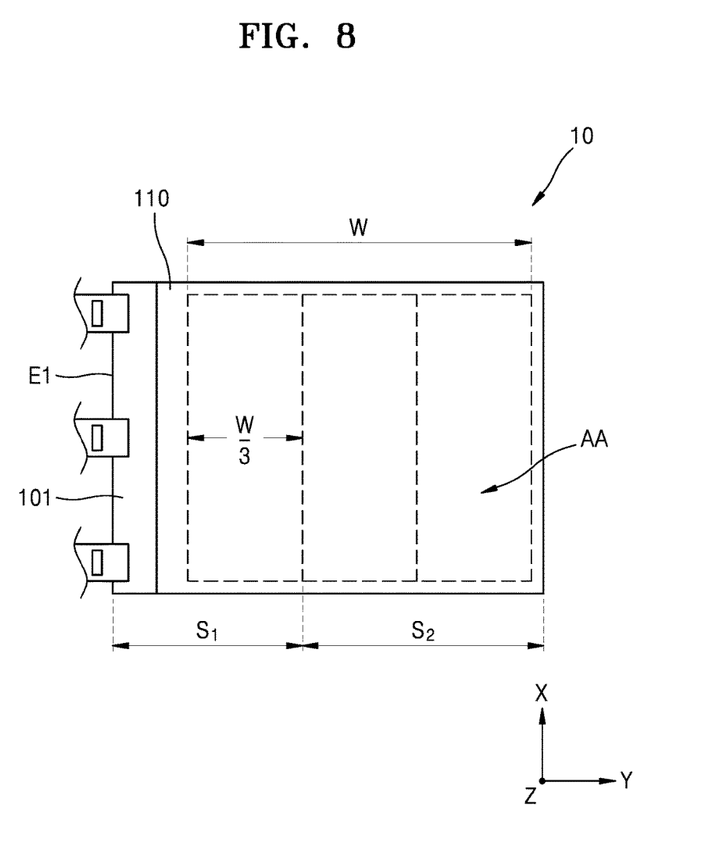
FIG. 8 is a schematic plan view of the flexible display panel of the rollable display apparatus of FIG. 1.

FIG. 7 is a schematic cross-sectional view of the rollable display apparatus 1 of FIG. 1; and FIG. 8 is a schematic plan view of the flexible display panel 10 of the rollable display apparatus 1 of FIG. 1. FIG. 7 illustrates the rollable display apparatus 1 taken along the line II-II' of FIG. 1, and FIG. 8 illustrates the flexible display panel 10 without the circuit substrate 40 for convenience of explanation. FIGS. 7 and 8 will now be described in cooperation with FIG. 5.

Referring to FIGS. 5, 7 and 8, the flexible substrate 101 may include a first region S1 including one end to be coupled with the rolling drum 20, and a second region S2 adjacent to the first region S1 and farther from the rolling drum 20 than the first region S1. In an embodiment, the first grooves 114 formed on the second layer 113 may be located only within the first region S1.

Because the stress generated while the flexible display panel 10 is being rolled is inversely proportional to the radius of curvature and is proportional to the thickness of the flexible display panel 10 and a Young's modulus of a material used to form the second layer 113, while the flexible display panel 10 is being rolled, the one end of the flexible display panel 10, from which rolling starts, has a rolling stress having a greatest value, and the stress generated due to the rolling gradually decreases in a direction toward the other end of the flexible display panel 10 opposite to the one end. In particular, because the stress generated during the rolling rapidly increases in a direction from the second region S2 to the first region S1, the first grooves 114, in an embodiment, may be formed only in the first region S1, and thus the stress generated in the first region S1 may be reduced, to thereby prevent or substantially prevent the second layer 113 from being damaged by the stress.

In an embodiment, a width of the first region S1 in the second direction (e.g., the Y direction) perpendicular to the first direction (e.g., the X direction) may be at most twice the perimeter length of the rolling drum 20. In other words, because a large rolling stress is generated on a wound region of the flexible display panel 10 that is obtained by winding the flexible display panel 10 around the outer surface of the rolling drum 20 twice, due to a small radius of curvature, the first grooves 114 may be formed on this region to thereby reduce or disperse the stress. The perimeter length of the rolling drum 20 denotes a measured length of the outer circumferential surface of the rolling drum 20. For example, when the rolling drum 20 has a cylindrical shape and a cross-section of the rolling drum 20 perpendicular to the length direction (e.g., the X direction) of the rolling drum 20 is a circle having a radius R, the perimeter length of the rolling drum 20 may be the length of the circumference of the circle, i.e. $2\pi R$.

When a width W of a display region AA in the second direction (e.g., the Y direction) perpendicular to the first direction (e.g., the X direction) is divided into three equal parts, a boundary between the first region S1 and the second region S2 may be located within a width W/3 of a part that is closest to the rolling drum 20 from among the three equal parts. In other words, the first region S1 including the plurality of first grooves 114 is between the one end E1 of the substrate 101 and a point closer to the one end E1 among a point corresponding to $\frac{1}{3}$ of the width W of the display region AA in the second direction (e.g., the Y direction) and a point when the flexible display panel 10 is wound around the outer surface of the rolling drum 20 twice.

Accordingly, damage to the second layer 113 in the first region S1 having rapidly-increasing stress compared with the second region S2 may be prevented or substantially prevented, and formation of the first grooves 114 may be minimized or reduced, thereby minimizing or reducing interference in an image displayed on the flexible display panel 10 by the first grooves 114.

FIGS. 9-12 are cross-sectional views taken along a line corresponding to the line III-III' of FIG. 1, according to further embodiments.

Figure 9:
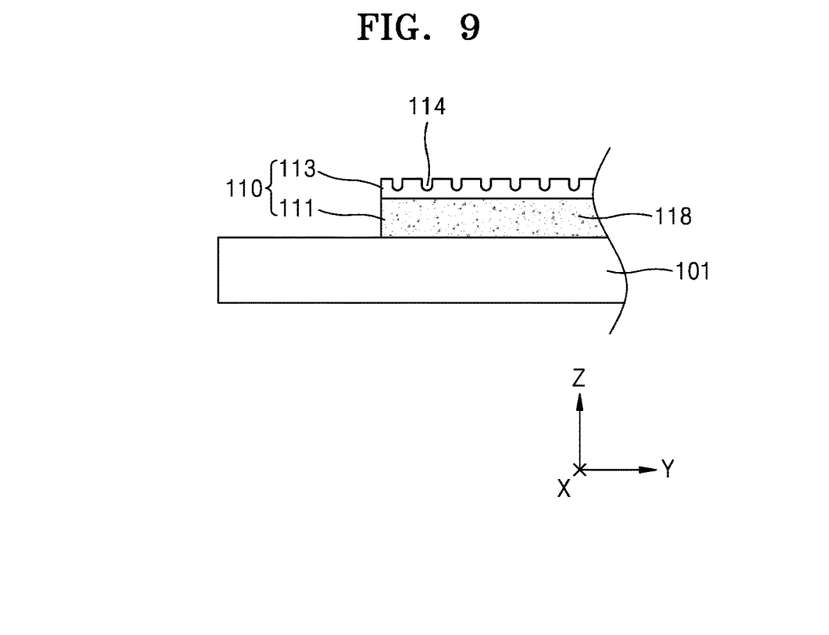
FIG. 9 is a cross-sectional view taken along a line III-Iii' of FIG. 1, according to an embodiment.

Referring to FIG. 9, the first protection film 110, which is on a surface of the flexible substrate 101, may include a first layer 111 including an elastic polymer, and a second layer 113 located on the first layer 111 and having a smaller surface frictional force than the first layer 111. A plurality of first grooves 114 may be formed on at least one region of the second layer 113. The plurality of first grooves 114 may extend in a first direction (e.g., the X direction), and, as described above with reference to FIG. 6, the first grooves 114 may be filled with the organic material 116.

In an embodiment, a plurality of metal particles 118 may be dispersed within the first layer 111. The plurality of metal particles 118 transmits and disperses static electricity generated due to friction during rolling of the flexible display panel 10 to a plurality of paths, and the static electricity may extinguish while being dispersed. Thus, rolling of the flexible display panel 10 may be prevented or substantially prevented from being affected by electrostatic attraction.

Figure 10:
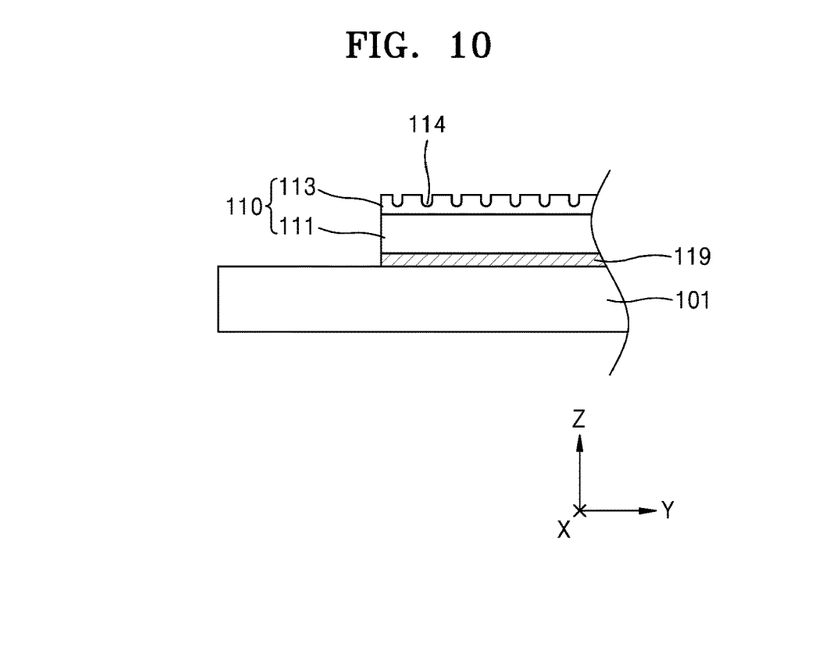
FIG. 10 is a cross-sectional view taken along the line III-III' of FIG. 1, according to another embodiment.

Referring to FIG. 10, the first protection film 110, which is on a surface of the flexible substrate 101, may include a first layer 111 including an elastic polymer, and a second layer 113 located on the first layer 111 and having a smaller surface frictional force than the first layer 111. A plurality of first grooves 114 may be formed on at least one region of the second layer 113. The plurality of first grooves 114 may extend in a first direction (e.g., the X direction), and, as described above with reference to FIG. 6, the first grooves 114 may be filled with the organic material 116.

A conductive layer 119 may be further formed between the first protection film 110 and a first surface of the substrate 101. The conductive layer 119 may include a light-transmissive conductor, such as indium tin oxide (ITO), indium zinc oxide (IZO), zinc oxide (ZnO), indium oxide ($In_2O_3$), or indium gallium oxide (IGO), a conductive polymer (e.g., PEDOT), and a conductive material (e.g., AgNW). The conductive layer 119 disperses static electricity generated due to friction during rolling of the flexible display panel 10, and accordingly, rolling of the flexible display panel 10 may be prevented or substantially prevented from being affected by electrostatic attraction.

Figure 11:
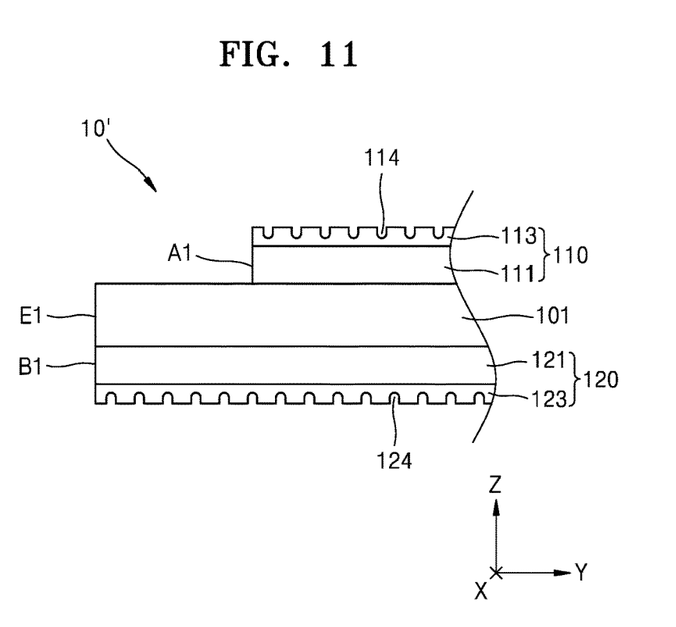
FIG. 11 is a cross-sectional view taken along the line III-III' of FIG. 1, according to another embodiment.

Referring to FIG. 11, a flexible display panel 10' according to another embodiment may include a first protection film 110 on a first surface of the flexible substrate 101, and a second protection film 120 on a second surface of the flexible substrate 101 opposite to the first surface. Although not shown in FIG. 11, the first protection film 110 and the second protection film 120 may be bonded to the first surface and the second surface of the flexible substrate 101, respectively, by the adhesion layer 400 of FIG. 3.

The first protection film 110 may include a first layer 111 including an elastic polymer, and a second layer 113 located on the first layer 111 and having a smaller surface frictional force than the first layer 111. A plurality of first grooves 114 may be formed on at least one region of the second layer 113. The plurality of first grooves 114 may extend in a first direction (e.g., the X direction), and, as described above with reference to FIG. 6, the first grooves 114 may be filled with the organic material 116.

The second protection film 120 may include a third layer 121 including an elastic polymer, and a fourth layer 123 located on the third layer 121 and having a smaller surface frictional force than the third layer 121. The fourth layer 123 may be farther from the second surface than the third layer 121.

The fourth layer 123 may include a plurality of second grooves 124 indented in a depth direction of the fourth layer 123 away from a surface of the fourth layer 123. The second grooves 124 may have same shapes as the first grooves 114. In an embodiment, the third layer 121 may be the same as the first layer 111, and the fourth layer 123 may be the same as the second layer 113, such that the first protection film 110 and the second protection film 120 may be symmetrical to each other about the flexible substrate 101.

In an embodiment, an interval between the end E1 of the flexible substrate 101, which is closest to the rolling drum 20 of FIG. 1, and the end A1 of the first protection film 110 may be greater than an interval between the end E1 of the flexible substrate 101 and an end B1 of the second protection film 120. In an embodiment, the second protection film 120 may have a same area as the flexible substrate 101. Accordingly, the first layer 111 and the third layer 121 may be prevented from contacting each other while the flexible display panel 10' is being rolled, and thus the flexible display panel 10' may be smoothly rolled. Moreover, a central surface of the flexible display panel 10 is formed on the display layer 200, and thus damage to the display layer 200 may be effectively prevented.

In an embodiment, the second grooves 124 may be filled with the same material as the organic material 116 of FIG. 6 filling the first grooves 114. When the fourth layer 123 includes an inorganic material, a coupling agent may be coated on surfaces of the second grooves 124.

In an embodiment, the second grooves 124 may be formed on the entire area of the second protection film 120, or may be formed on some of the area of the second protection film 120. In an embodiment, the second grooves 124 may be formed in a region of the second protection film 120 that corresponds to the region of the first protection film 110 in which the first grooves 114 are formed.

Figure 12:
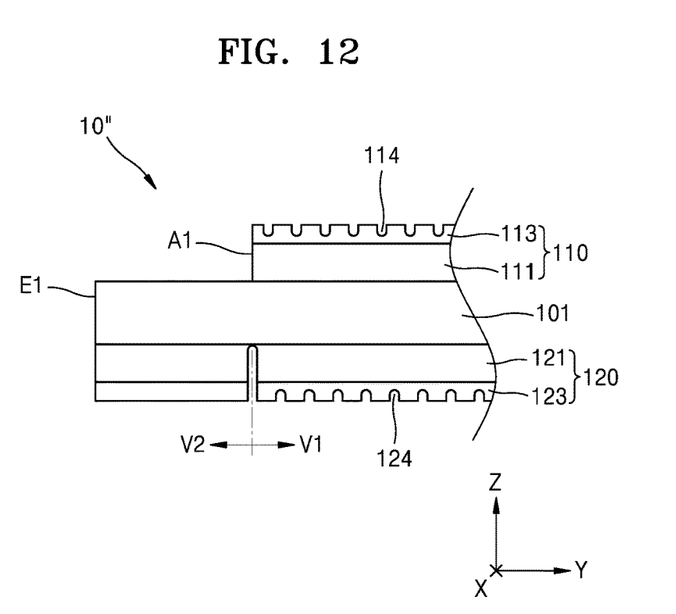
FIG. 12 is a cross-sectional view taken along the line III-III' of FIG. 1, according to another embodiment.

Referring to FIG. 12, a flexible display panel 10″ may include a first protection film 110 on the first surface of the flexible substrate 101, and a second protection film 120 on a second surface of the flexible substrate 101 opposite to the first surface.

The first protection film 110 may include a first layer 111 including an elastic polymer, and a second layer 113 located on the first layer 111 and having a smaller surface frictional force than the first layer 111. A plurality of first grooves 114 may be formed on at least one region of the second layer 113. In an embodiment, the first protection film 110 may have a smaller size than the flexible substrate 101, and the pad unit P of FIG. 1 may be between the end E1 of the flexible substrate 101 and the end A1 of the first protection film 110.

The second protection film 120 may include a third layer 121 including an elastic polymer, and a fourth layer 123 located on the third layer 121 and having a smaller surface frictional force than the third layer 121. The second protection film 120 may further include a plurality of second grooves 124 indented in a depth direction of the second protection film 120 away from a surface of the second protection film 120.

The second protection film 120 may include a first overlapping portion V1 overlapping with the first protection film 110, and a second overlapping portion V2 between the end E1 of the flexible substrate 101 and the end A1 of the first protection film 110. In other words, the second overlapping portion V2 may overlap with the pad unit P of FIG. 1. In an embodiment, the first overlapping portion V1 and the second overlapping portion V2 may be separated from each other. The plurality of second grooves 124 may be formed on only the first overlapping portion V1. In an embodiment, the first overlapping portion V1 and the first protection film 110 may be symmetrical to each other about the flexible substrate 101.

According to embodiments of the present invention, a rollable display apparatus may prevent or substantially prevent the layers included in the flexible display apparatus from being detached from each other due to accumulation of stress, by distributing accumulated stress that is generated during rolling. Of course, the scope of the present invention is not limited thereto.

While the inventive concept has been particularly shown and described with reference to some exemplary embodiments thereof, it will be understood by those of ordinary skill in the art that various changes in form and details may be made therein without departing from the spirit and scope as defined by the following claims.

What is claimed is:

1. A rollable display apparatus comprising:
   a rolling drum; and
   a flexible display panel comprising an end bonded to the rolling drum, the flexible display panel being windable around an outer circumferential surface of the rolling drum,
   wherein the flexible display panel comprises:
      a flexible substrate including a first surface on which a display device is arranged; and
      a first protection film over the first surface of the flexible substrate,
   wherein the first protection film comprises a first layer comprising an elastic polymer, and a second layer on the first layer and having a smaller surface frictional force than the first layer, and
   wherein the second layer comprises a plurality of first grooves each indented in a depth direction of the second layer toward the first layer from a surface of the second layer facing away from the first layer.

2. The rollable display apparatus of claim 1, wherein first grooves of the plurality of first grooves extend in a first direction that is parallel to a lengthwise direction of the rolling drum.

3. The rollable display apparatus of claim 2, wherein intervals between first grooves of the plurality of first grooves in a second direction perpendicular to the first direction are different from one another.

4. The rollable display apparatus of claim 3, wherein the intervals between the first grooves increase in a direction from the end to another end of the flexible display panel opposite to the end.

5. The rollable display apparatus of claim 2,
   wherein the flexible substrate comprises a first region comprising the end, and a second region adjacent to the first region and farther from the rolling drum than the first region, and
   wherein the plurality of first grooves is located in the first region of the flexible substrate.

6. A rollable display apparatus comprising:
   a rolling drum; and
   a flexible display panel comprising an end bonded to the rolling drum, the flexible display panel being windable around an outer circumferential surface of the rolling drum,
   wherein the flexible display panel comprises:
      a flexible substrate including a first surface on which a display device is arranged; and
      a first protection film over the first surface of the flexible substrate,
   wherein the first protection film comprises a first layer comprising an elastic polymer, and a second layer on the first layer and having a smaller surface frictional force than the first layer,
   wherein the second layer comprises a plurality of first grooves each indented in a depth direction of the second layer from a surface of the second layer,
   wherein first grooves of the plurality of first grooves extend in a first direction that is parallel to a lengthwise direction of the rolling drum,
   wherein the flexible substrate comprises a first region comprising the end, and a second region adjacent to the first region and farther from the rolling drum than the first region,
   wherein the plurality of first grooves is located in the first region of the flexible substrate, and
   wherein a width of the first region in a second direction perpendicular to the first direction is twice or less of a perimeter length of the rolling drum.

7. A rollable display apparatus comprising:
   a rolling drum; and
   a flexible display panel comprising an end bonded to the rolling drum, the flexible display panel being windable around an outer circumferential surface of the rolling drum,
   wherein the flexible display panel comprises:
      a flexible substrate including a first surface on which a display device is arranged; and
      a first protection film over the first surface of the flexible substrate,
   wherein the first protection film comprises a first layer comprising an elastic polymer, and a second layer on the first layer and having a smaller surface frictional force than the first layer, wherein the second layer comprises a plurality of first grooves each indented in a depth direction of the second layer from a surface of the second layer, wherein first grooves of the plurality of first grooves extend in a first direction that is parallel to a lengthwise direction of the rolling drum, wherein the flexible substrate comprises a first region comprising the end, and a second region adjacent to the first region and farther from the rolling drum than the first region, wherein the plurality of first grooves is located in the first region of the flexible substrate, wherein the flexible display panel comprises a display region in which the display device is located, and wherein a boundary between the first region and the second region is located corresponding to ⅓ or less of a width of the display region in a second direction perpendicular to the first direction.

8. The rollable display apparatus of claim 1, wherein first grooves of the plurality of first grooves are filled with an organic material.

9. The rollable display apparatus of claim 8, wherein the second layer comprises an inorganic material, and surfaces of the plurality of first grooves are coated with a coupling agent.

10. A rollable display apparatus comprising:
a rolling drum; and
a flexible display panel comprising an end bonded to the rolling drum, the flexible display panel being windable around an outer circumferential surface of the rolling drum,
wherein the flexible display panel comprises:
    a flexible substrate including a first surface on which a display device is arranged; and
    a first protection film over the first surface of the flexible substrate,
wherein the first protection film comprises a first layer comprising an elastic polymer, and a second layer on the first layer and having a smaller surface frictional force than the first layer,
wherein the second layer comprises a plurality of first grooves each indented in a depth direction of the second layer from a surface of the second layer,
wherein the flexible display panel further comprises a pad unit located on the end, and a circuit substrate electrically connected to the pad unit,
wherein the rolling drum comprises an insertion groove extending in a lengthwise direction of the rolling drum, and
wherein the circuit substrate is inserted into the insertion groove.

11. The rollable display apparatus of claim 10, wherein the circuit substrate and the pad unit are connected to each other by a flexible printed circuit board (PCB) comprising an integrated circuit, and the flexible PCB is bent along an outer surface of the rolling drum and extends within the insertion groove.

12. The rollable display apparatus of claim 1, wherein the flexible display panel further comprises a second protection film on a second surface opposite to the first surface.

13. The rollable display apparatus of claim 12, wherein the second protection film comprises a third layer comprising an elastic polymer, and a fourth layer having a smaller surface frictional force than the third layer, and the fourth layer is farther from the second surface than the third layer.

14. The rollable display apparatus of claim 13, wherein the fourth layer comprises a plurality of second grooves each indented in a depth direction of the fourth layer from a surface of the fourth layer.

15. The rollable display apparatus of claim 14, wherein second grooves of the plurality of second grooves are filled with an organic material.

16. A rollable display apparatus comprising:
a rolling drum; and
a flexible display panel comprising an end bonded to the rolling drum, the flexible display panel being windable around an outer circumferential surface of the rolling drum,
wherein the flexible display panel comprises:
    a flexible substrate including a first surface on which a display device is arranged; and
    a first protection film over the first surface of the flexible substrate,
wherein the first protection film comprises a first layer comprising an elastic polymer, and a second layer on the first layer and having a smaller surface frictional force than the first layer,
wherein the second layer comprises a plurality of first grooves each indented in a depth direction of the second layer from a surface of the second layer,
wherein the flexible display panel further comprises a second protection film on a second surface opposite to the first surface, and
wherein an interval between an end of the flexible substrate closest to the rolling drum and an end of the first protection film is greater than an interval between the end of the flexible substrate and an end of the second protection film.

17. The rollable display apparatus of claim 16, wherein a pad unit is located between the end of the flexible substrate and the end of the first protection film.

18. The rollable display apparatus of claim 17, wherein the second protection film comprises a first overlapping portion overlapping with the first protection film, and a second overlapping portion overlapping with the pad unit and separated from the first overlapping portion.

19. The rollable display apparatus of claim 18, wherein the first overlapping portion comprises a plurality of second grooves each indented in a depth direction of the second protection film from a surface of the second protection film.

20. The rollable display apparatus of claim 12, wherein the flexible display panel further comprises a first adhesion layer between the first surface and the first protection film and a second adhesion layer between the second surface and the second protection film.

21. The rollable display apparatus of claim 1, wherein a plurality of metal particles are dispersed in the first layer.

22. The rollable display apparatus of claim 1, further comprising a conductive layer between the first protection film and the first surface.

23. The rollable display apparatus of claim 1, wherein the flexible display panel further comprises an encapsulation member located between the flexible substrate and the first protection film and encapsulating the display device.

24. The rollable display apparatus of claim 1, wherein the display device comprises an organic light-emitting device.

* * * * *